(12) United States Patent
Heng (10) Patent No.: US 10,512,179 B2
(45) Date of Patent: Dec. 17, 2019

(54) FLEXIBLE DISPLAY DEVICE AND ELECTRONIC DEVICE

(71) Applicant: SHANGHAI TIANMA AM-OLED CO., LTD., Shanghai (CN)

(72) Inventor: Lin Heng, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/244,108

(22) Filed: Jan. 10, 2019

(65) Prior Publication Data

US 2019/0150302 A1 May 16, 2019

(30) Foreign Application Priority Data

Aug. 28, 2018 (CN) .......................... 2018 1 0985578

(51) Int. Cl.
*H05K 5/00* (2006.01)
*H05K 5/02* (2006.01)
*E05D 7/00* (2006.01)
*G09F 9/30* (2006.01)
*E05D 3/02* (2006.01)

(52) U.S. Cl.
CPC ............ *H05K 5/0017* (2013.01); *E05D 7/00* (2013.01); *G09F 9/301* (2013.01); *H05K 5/0226* (2013.01); *E05D 3/02* (2013.01); *E05Y 2900/606* (2013.01)

(58) Field of Classification Search
CPC .... H05K 5/0017; H05K 5/0226; G09F 9/301; E05D 7/00; E05D 3/02; E05Y 2900/606; G06F 1/1652; G06F 1/1681; G06F 1/1616
See application file for complete search history.

(56) References Cited

U.S. PATENT DOCUMENTS

| 9,470,404 | B2 * | 10/2016 | Lee | ........................ | F21V 21/30 |
| 9,971,382 | B2 * | 5/2018 | Ahrens | .................... | E05D 3/022 |
| 2013/0021762 | A1 * | 1/2013 | van Dijk | ............... | G06F 1/1652 361/749 |
| 2015/0233162 | A1 * | 8/2015 | Lee | ......................... | H04M 1/02 16/223 |
| 2015/0370287 | A1 * | 12/2015 | Ko | ........................ | G06F 1/1626 361/749 |
| 2016/0007441 | A1 * | 1/2016 | Matsueda | ............. | G06F 1/1652 361/749 |

(Continued)

FOREIGN PATENT DOCUMENTS

| CN | 106255935 A | 12/2016 |
| CN | 107369386 A | 11/2017 |

*Primary Examiner* — Abhishek M Rathod
(74) *Attorney, Agent, or Firm* — Kilpatrick Townsend & Stockton, LLP (57) ABSTRACT

A flexible display device and an electronic device are provided. The flexible display device includes a flexible display panel, a rigid structure and a support structure. The support structure includes a set of support arms including a first support arm and a second support arm. The rigid structure is bent at a preset angle based on a combined state of the set of support arms so that the flexible display panel supported by the rigid structure is bent at a same angle as the preset angle. The combined state includes a first use state and a second use state. The first support arm and the second support arm are located on a same plane in the first use state. The preset angle is formed between the first support arm and the second support arm in the second use state.

14 Claims, 9 Drawing Sheets

(56) References Cited

U.S. PATENT DOCUMENTS

| | | | |
|---|---|---|---|
| 2016/0278222 A1* | 9/2016 | Lee | H01F 7/20 |
| 2017/0139663 A1* | 5/2017 | Ahn | G01B 7/30 |
| 2017/0169741 A1* | 6/2017 | Lim | G09F 9/00 |
| 2017/0192460 A1* | 7/2017 | Watanabe | G09F 9/00 |
| 2017/0329567 A1 | 11/2017 | Choi et al. | |
| 2018/0242466 A1* | 8/2018 | Lee | G09F 9/301 |

* cited by examiner

Figure 1

PRIOR ART

FLEXIBLE DISPLAY DEVICE AND ELECTRONIC DEVICE

CROSS REFERENCE TO RELATED APPLICATION

The present application claims the priority to Chinese Patent Application No. 201810985578.5, titled "FLEXIBLE DISPLAY DEVICE AND ELECTRONIC DEVICE", filed on Aug. 28, 2018 with the Chinese Patent Office, which is incorporated herein by reference in its entirety.

FIELD

The present disclosure relates to the field of display, and particularly to a flexible display device and an electronic device.

BACKGROUND

With the rapid development of the display technology, the display screen has more and more functions and types. The flexible display panel is widely applied in bendable and foldable display devices due to low power consumption, being bendable, and flexibility.

For a foldable display device such as a mobile phone having a foldable screen, the flexible screen may be required to be bent according to a predetermined bending axis. However, during the process that the existing flexible display device is bent, the deviation between an actual bending axis and the predetermined bending axis is large.

SUMMARY

In view of this, a flexible display device and an electronic device are provided in the present disclosure, to reduce a deviation between an actual bending axis generated during a process that a flexible display device is bent and a predetermined bending axis, so that a flexible display panel can be bent in accordance with a predetermined bending trajectory.

The flexible display device provided in the present disclosure includes: a flexible display panel, a rigid structure and a support structure;

the support structure includes a set of support arms including a first support arm and a second support arm, the first support arm and the second support arm have separated structures and are configured to support the rigid structure;

the rigid structure has a first surface supporting the flexible display panel, and the rigid structure is bent at a preset angle based on a combined state of the set of support arms so that the flexible display panel supported by the rigid structure is bent at a same angle as the preset angle; and the combined state of the set of support arms includes a first use state and a second use state, where the first support arm and the second support arm are located on a same plane in the first use state, and the preset angle is formed between the first support arm and the second support arm in the second use state.

An electronic device is further provided, which includes the flexible display device described above.

The flexible display device provided in the present disclosure includes a flexible display panel, a rigid structure and a support structure. The support structure includes a set of support arms including a first support arm and a second support arm, and the first support arm and the second support arm have separated structures and are configured to support the rigid structure. The rigid structure has a first surface supporting the flexible display panel, and the rigid structure is bent at a preset angle based on a combined state of the set of support arms so that the flexible display panel supported by the rigid structure is bent at a same angle as the preset angle. The combined state of the set of support arms includes a first use state and a second use state. In the first use state, the first support arm and the second support arm are located on a same plane. In the second use state, the preset angle is formed between the first support arm and the second support arm. It can be seen that the position at which the bending axis of the rigid structure is formed can be controlled by controlling the combined state of the first support arm and the second support arm in the support structure, and the deviation between the actual bending axis formed during the process that the flexible display device is bent and the predetermined bending axis can be reduced, so that the flexible display panel can be bent in accordance with the predetermined bending trajectory.

BRIEF DESCRIPTION OF THE DRAWINGS

The embodiments of the present disclosure, the drawings used in the description of the embodiments are illustrated below. Further, the drawings in the following description show embodiments of the present disclosure.

DETAILED DESCRIPTION

The embodiments of the present disclosure are described below in conjunction with the drawings in the embodiments of the present disclosure. Apparently, the described embodiments are only a part of the embodiments of the present disclosure, rather than all of the embodiments.

Figure 1:
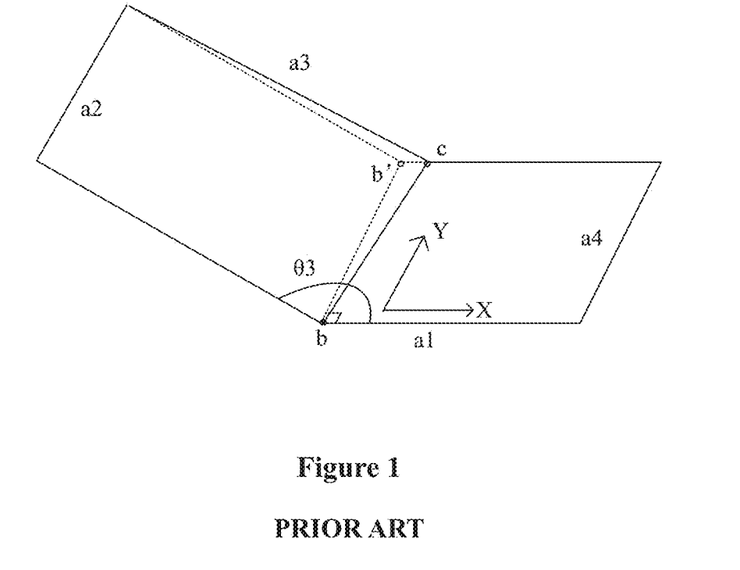
FIG. 1 is a schematic view showing bending of a flexible display panel in the conventional technology.

Reference is made to FIG. 1, which is a schematic view showing bending of a flexible display panel in the conventional technology. During a process that the flexible display panel is bent, it is generally desired that an extension direction of a bending trajectory (i.e., a predetermined bending trajectory) of the flexible display panel is perpendicular to an extension direction of a bottom edge of the flexible display panel. Specifically, it is assumed that a bottom edge a1 of the flexible display panel extends in a direction X, the extension direction of the predetermined bending trajectory of the flexible display panel is a direction Y perpendicular to the direction X. However, since force received by the rigid structure is uneven during the process that the flexible display panel is bent, the received maximum force near a bending axis is not on the predetermined bending axis, resulting in an actual bending axis of the display panel being not perpendicular to the direction X. It is assumed that the predetermined bending trajectory of the flexible display panel is represented by a line bb'. During the process that the force is applied to the flexible display panel to cause the flexible display panel to be bent, since the magnitude of the force received at points on the predetermined bending trajectory is not completely the same, a bending point at one end of the predetermined bending trajectory may be shifted from the point b' to a point c in a case where the bending point h at the other end of the predetermined bending trajectory is unchanged. In this case, the actual bending trajectory is represented by a line bc in FIG. 1.

Figure 2:
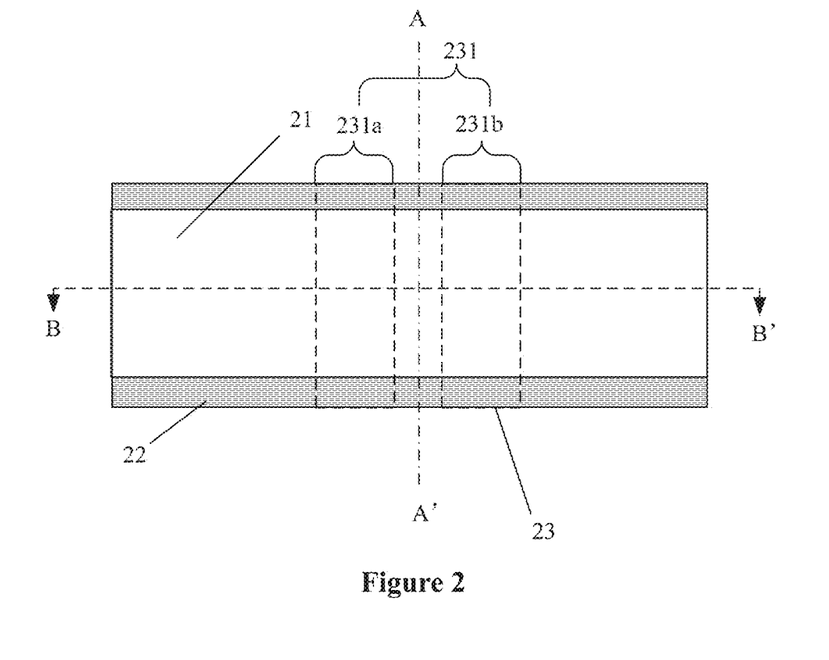
FIG. 2 is a schematic top view of a flexible display device according to an embodiment of the present disclosure.
Figure 3:
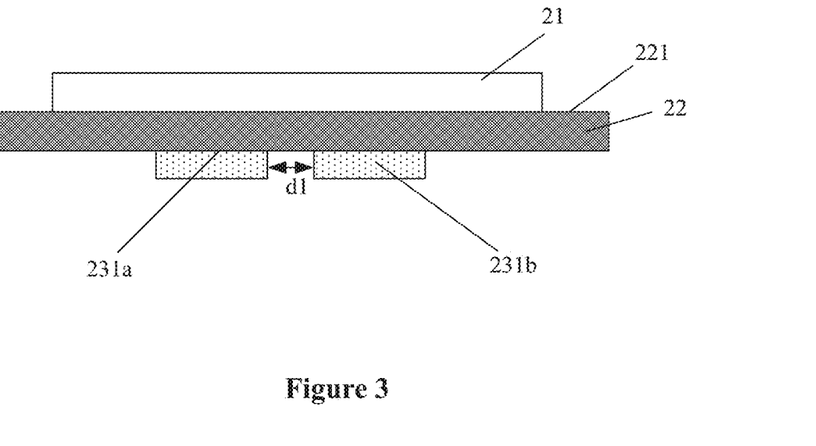
FIG. 3 is a schematic sectional view of the flexible display device taken along a line BB' shown in FIG. 2.

Based on above, a flexible display device is provided according to an embodiment of the present disclosure. Reference is made to FIG. 2 and FIG. 3. FIG. 2 is a schematic top view of a flexible display device according to an embodiment of the present disclosure, and FIG. 3 is a schematic sectional view of the flexible display device taken along a line BB' shown in FIG. 2. As shown in FIG. 2, the flexible display device includes a flexible display panel 21, a rigid structure 22, and a support structure 23.

As shown in FIG. 2 and FIG. 3, in the present embodiment, the support structure 23 includes a set of support arms 231 for supporting the rigid structure 22. The set of support arms 231 includes a first support arm 231a and a second support arm 231b. It should be noted that, in this embodiment, the first support arm 231a and the second support arm 231b have separated structures and are used to support the rigid structure 22. In one embodiment of the present disclosure, a virtual bending axis AA' may be formed between the first support arm 231a and the second support arm 231b, and the first support arm 231a and the second support arm 231b are rotatable around the bending axis with respect to each other. In this way, multiple angles can be formed between the first support arm 231a and the second support arm 231b, and thus the first support arm 231a and the second support arm 231b can form multiple bending states.

Moreover, in this embodiment, the rigid structure 22 is fixedly connected to the flexible display panel 21. The rigid structure 22 has a first surface 221 supporting the flexible display panel 21. The first surface 221 is used to provide supporting force for the flexible display panel 21 and maintain a current attitude of the flexible display panel 21, so as to avoid that the flexible display panel 21 may not be maintained at a fixed attitude due to being pliable. For example, in a case that the flexible display panel 21 is in a planar state, the rigid structure 22 is used for maintaining the planar attitude of the flexible display panel 21. In addition, in a case that the flexible display panel 21 is in a bending state, the rigid structure 22 is used for maintaining the bending attitude of the flexible display panel 21.

Specifically, in the present embodiment, the flexible display panel 21 is a display panel made of a soft material that can be bent and deformed, and may be applied to a portable electronic device. In an embodiment of the present disclosure, the flexible display panel may include a thin film transistor array layer and a light emitting function layer. The thin film transistor array layer may include multiple thin film transistors. The multiple thin film transistors may form a pixel circuit for driving a light emitting element in the light emitting functional layer to emit light so as to realize display. The light emitting element in the light emitting function layer may include at least one of an organic light emitting diode and an inorganic light emitting diode. Compared with a conventional display panel, the flexible display panel 21 is thinner and lighter, and has lower power consumption. However, due to the softness, the flexible display panel 21 may be required to be supported by force in a case that the flexible display panel 21 presents a predetermined attitude. The flexible display panel 21 may not be maintained at the predetermined attitude if no external force is applied.

The rigid structure 22 may be deformed under external force, and the deformed attitude is maintained after the external force is removed. In this case, after the rigid structure 22 is bent at a certain angle, the rigid structure 22 may still be maintained at the bent shape at the angle. Therefore, in the present embodiment, the rigid structure 22 is selected to support the flexible display panel 21, so that the flexible display panel 21 may have a bent shape at the same angle as that of the rigid structure 22, and the bending shape at the angle can be maintained.

In addition, in the embodiment of the present disclosure, the rigid structure 22 is bent at a preset angle based on a combined state of the set of support arms 231, so that the flexible display panel 21 supported by the rigid structure 22 is bent at a same angle as the preset angle.

Figure 4:
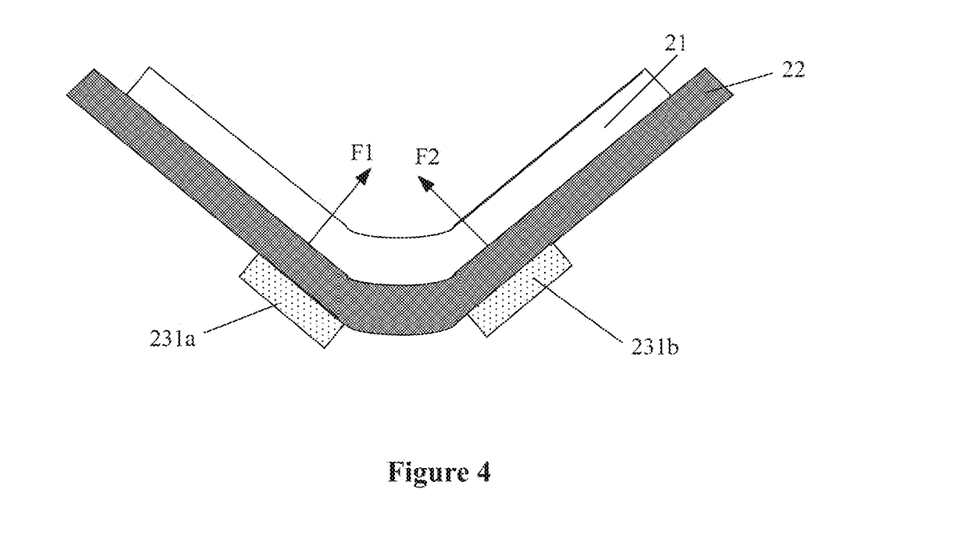
FIG. 4 is a schematic structural view of a flexible display device in a bending state according to an embodiment of the present disclosure.

Specifically, in this embodiment, the combined state of the set of support arms 231 includes a first use state S1 and a second use state S2. In the first use state S1, as shown in FIG. 3, the first support arm 231a and the second support arm 231b are located on a same plane. In the second use state S2, as shown in FIG. 4, a preset angle is formed between the first support arm 231a and the second support arm 231b. That is, in the present embodiment, in a case that the first support arm 231a and the second support arm 231b are on the same plane, the combined state of the set of support arms 231 is defined as the first use state. In a case that a preset angle (which is not 180°) is formed between the first support arm 231a and the second support arm 231b, the combined state of the set of support arms 231 is defined as the second use state.

It should be noted that, in this embodiment, the first support arm 231a and the second support arm 231b have separated structures, that is, the first support arm 231a is independent from the second support arm 231b in structure. The first support arm 231a and the second support arm 231b may be arranged opposite to each other. For example, in the case that the first support arm 231a and the second support arm 231b are in the first use state, a distance between the first support arm 231a and the second support arm 231b is set as d1 which is greater than zero.

It should be noted that, in the embodiment of the present disclosure, the first support arm 231a and the second support arm 231b in the support structure 23 have separated structures. Therefore, during the process that the flexible display device is bent, a region of the rigid structure 22 located on a first side of the predetermined bending axis is fixed by using the first support arm 231a, and then a region of the flexible display panel 21 located on the first side of the predetermined bending axis is fixed by fixedly connecting the rigid structure 22 to the flexible display panel 21. In this way, the region of the rigid structure 22 located on the first side of the predetermined bending axis can be prevented from being deformed during the process that the flexible display panel 21 is bent, and thus the region of the flexible display panel 21 located on the first side of the predetermined bending axis can be prevented from being deformed during the process that the flexible display panel 21 is bent. In addition, a region of the rigid structure 22 located on a second side of the predetermined bending axis is fixed by using the second support arm 231b, and then a region of the flexible display panel 21 located on the second side of the predetermined bending axis is fixed by fixedly connecting the rigid structure 22 to the flexible display panel 21, so that the region of the flexible display panel 21 located on the second side of the predetermined bending axis can be prevented from being deformed during the process that the flexible display panel 21 is bent. In this way, an actual bending axis of the flexible display panel 21 is defined in a region between the first support arm 231a and the second support aria 231b, and a deviation between the actual bending axis and the predetermined bending axis of the flexible display panel 21 is reduced, so that the flexible display device can be bent in accordance with the predetermined bending trajectory. The first side and the second side are two opposite sides of the flexible display panel 21 with respect to a bending axis.

It should further be noted that, in any one of the above embodiments, the bending axis where the predetermined bending trajectory of the flexible display panel 21 is located may be fixed. For example, if the flexible display panel 21 has a rectangular shape, it may be considered that the predetermined bending trajectory is parallel to a short side of the rectangular shape, and the rectangular flexible display panel 21 is bent symmetrically in accordance with the predetermined bending trajectory. In this case, the symmetric axis is the bending axis where the predetermined bending trajectory of the flexible display panel 21 is located. Practically, the bending axis where the predetermined bending trajectory of the flexible display panel 21 is located may be set by a user according to usage habits of the user. For example, a boundary between a quarter and other three quarters of an area of the flexible display screen may be determined as the predetermined bending trajectory.

It can be seen that in the flexible display device according to the embodiment, the flexible display panel 21 is supported by the rigid structure 22, the rigid structure 22 is further supported by the support structure 23, an actual bending axis of the rigid structure 22 is defined in the region between the first support arm 231a and the second support arm 231b by using the support structure 23, and the flexible display panel 21 is driven to be bent by fixedly connecting the rigid structure 22 to the flexible display panel 21. In this way, an actual bending axis of the flexible display panel 21 is defined in the region between the first support arm 231a and the second support arm 231b, and the deviation between the actual bending axis formed during the process that the flexible display device is bent and the predetermined bending axis is reduced, so that the flexible display device can be bent in accordance with the predetermined bending trajectory. After the flexible display panel 21 is bent, the bending state of the flexible display panel 21 is maintained by using the rigid structure 22, thereby maintaining the flexible display panel 21 at the current attitude.

Specifically, based on the above embodiment, in an embodiment of the present disclosure, the force is applied to the rigid structure 22 during the process that the flexible display device is bent, and the first support arm 231a and the second support arm 231b in the support structure 23 is driven by the rigid structure 22 to rotate, so as to adjust the combined state of the first support arm 231a and the second support arm 231b. In this case, a bending axis is formed in the region between the first support arm 231a and the second support arm 231b, and the flexible display panel 21 is driven to rotate, so that the flexible display panel 21 is bent around the bending axis, to realize the bending of the flexible display device. In the embodiment of the present disclosure, the support structure 23 is used to define the position of the actual bending axis of the rigid structure 22, so as to define the position of the actual bending axis of the flexible display device.

In another embodiment of the present disclosure, during the process that the flexible display device is bent, the force is applied to the first support arm 231a and the second support arm 231b in the support structure 23, to adjust the combined state of the first support arm 231a and the second support arm 231b. In this case, a bending axis is formed in the region between the first support arm 231a and the second support arm 231b, and the rigid structure 22 is driven by the support structure 23 to rotate, so that the rigid structure 22 is bent around the bending axis. As shown in FIG. 4, the first support arm 231a is used to provide force F1 in the same direction as a moving direction of the first support arm 231a for the rigid structure, the second support arm 231b is used to provide force F2 in the same direction as a moving direction of the second support arm 231b for the rigid structure, and the rigid structure is bent around the bending axis of the support structure 23 under both the force F1 and the force F2. The flexible display panel 21 is driven to rotate by fixedly connecting the rigid structure 22 to the flexible display panel 21, so that the flexible display panel 21 is bent around the bending axis, to realize the bending of the flexible display device. In the embodiment of the present disclosure, the support structure 23 is used not only to define the position of the actual bending axis of the flexible display device, but also to provide the bending force for the rigid structure 22 and the flexible display panel 21.

In other embodiments of the present disclosure, during the process that the flexible display device is bent, the force may be applied to the flexible display panel 21, or at least two of the flexible display panel 21, the rigid structure 22 and the support structure 23, which is not limited in the present disclosure, as long as the flexible display device can be bent.

Based on any one of the above embodiments, in an embodiment of the present disclosure, the rigid structure 22 may be made of a material such as metal, alloy or other materials having a certain hardness that can be deformed under external force and the deformed attitude may be maintained after the external force is removed. The rigid structure 22 may have a variety of forms. In an embodiment of the present disclosure, the rigid structure 22 may have the same shape as the flexible display panel 21. For example, in a case that the flexible display panel 21 has a rectangular shape, the rigid structure 22 may have the rectangular shape. In a case that the flexible display panel 21 has an elliptical shape, the rigid structure 22 may have the elliptical structure corresponding to the flexible display panel 21. In another embodiment of the present disclosure, the rigid structure 22 may have a different shape from the flexible display panel 21. For example, in a case that the flexible display panel 21 has an elliptical shape, the rigid structure 22 supporting the flexible display panel 21 may have a rectangular shape, which is not limited in the present disclosure. Specifically, the rigid structure 22 may have a sheet structure, a projection of the flexible display panel 21 on the rigid structure 22 is on the first surface of the rigid structure 22. Further, the rigid structure 22 has a flat surface, thereby providing uniform and good supporting for the flexible display panel 21.

It should be noted that the manner in which the flexible display panel 21 is fixed to the rigid structure 22 is not limited in the embodiment. For example, the flexible display panel 21 may be directly lapped on the rigid structure 22, and a first engagement groove for fixing the rigid structure 22 or a second engagement groove for fixing the flexible display panel 21 is arranged inside a casing of an electronic device, to fix the flexible display panel 21 to the rigid structure 22. In addition, the flexible display panel 21 may be fixedly connected to the rigid structure 22 by bonding. In addition, in other embodiments of the present disclosure, the flexible display panel 21 may be fixedly connected to the rigid structure 22 in other manners, which is not limited in the present disclosure, as long as the flexible display panel 21 located on the rigid structure 22 can be driven to be bent at the same angle as that of the rigid structure 22 during the process that the rigid structure 22 is bent at a preset angle.

Figure 5:
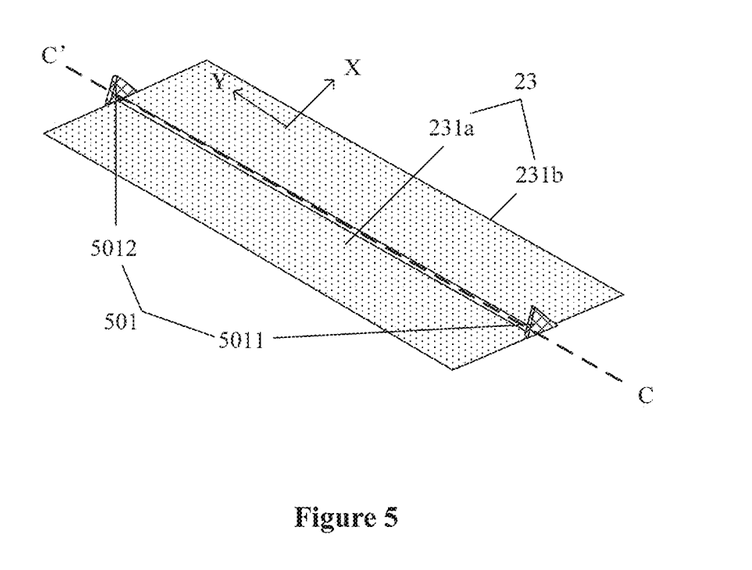
FIG. 5 is a partial schematic view of a flexible display device according to another embodiment of the present disclosure.
Figure 6:
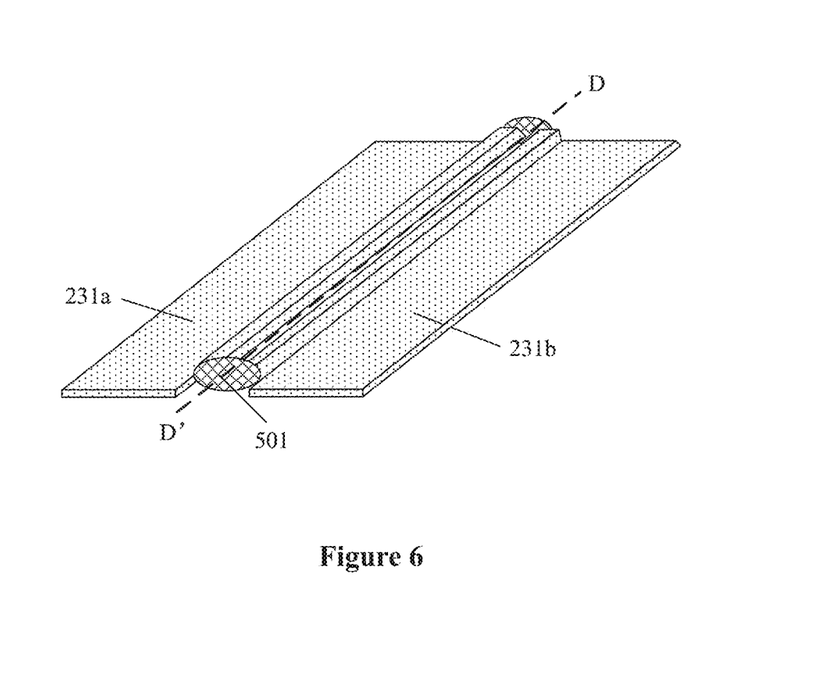
FIG. 6 is a partial schematic view of a flexible display device according to another embodiment of the present disclosure.

Based on any one of the above embodiments, in an embodiment of the present disclosure, the connection between the first support arm 231$a$ and the second support arm 231$b$ is described in detail, as shown in FIG. 5 and FIG. 6. FIG. 5 is a partial schematic view of a flexible display device according to another embodiment of the present disclosure, and FIG. 6 is a partial schematic view of a flexible display device according to another embodiment of the present disclosure. In the embodiments of the present disclosure, the flexible display device further includes a connection member 501. The connection member 501 is used to hinge the first support arm 231$a$ with the second support arm 231$b$ to control a distance between the first support arm 231$a$ and the second support arm 231$b$. With the connection member 501, the distance between the first support arm 231$a$ and the second support arm 231$b$ can be controlled by controlling a length of the connection member in a direction in which the first support arm 231$a$ and the second support arm 231$b$ are arranged, thereby controlling the position of the actual bending axis of the flexible display device.

Figure 7:
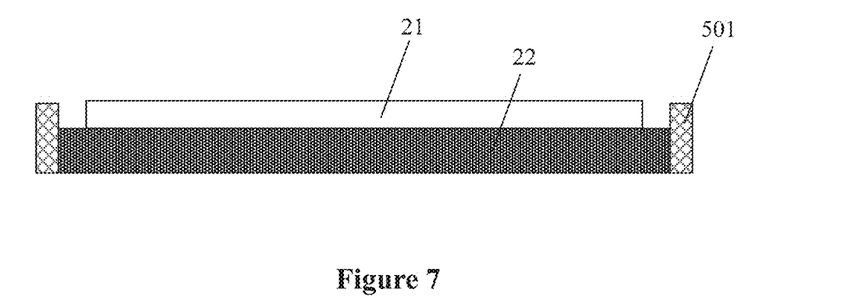
FIG. 7 is a schematic sectional view of the flexible display device taken along a line CC' shown in FIG. 5.
Figure 8:
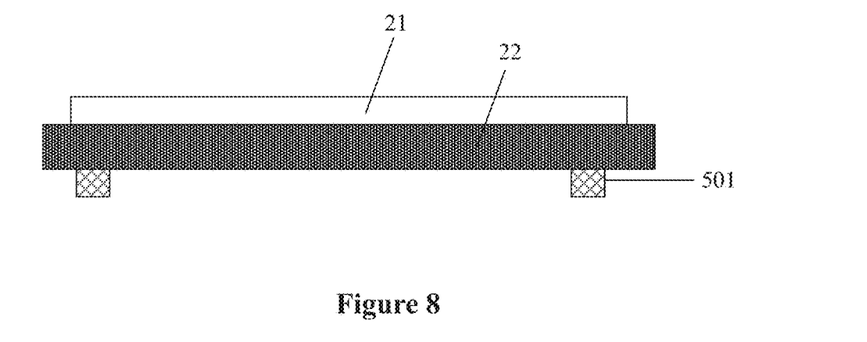
FIG. 8 is a schematic sectional view of the flexible display device taken along a DD' shown in FIG. 6.

Specifically, based on the above embodiments, in an embodiment of the present disclosure, reference is made to FIG. 7, which is a schematic sectional view of the flexible display device taken along a line CC shown in FIG. 5. In the embodiment of the present disclosure, the connection member 501 is arranged on two opposite sides of the rigid structure 22. In another embodiment of the present disclosure, reference is made to FIG. 8, which is a schematic sectional view of the flexible display device taken along a line DD' shown in FIG. 6. In the embodiment of the present disclosure, the connection member 501 is arranged on a surface of the rigid structure 22 facing away from the flexible display panel 21, which is not limited in the present disclosure, as long as the first support arm 231$a$ can be hanged with the second support arm 231$b$ via the connection member 501.

It should be noted that, in the embodiment of the present disclosure, the statement "the connection member 501 is used to hinge the first support arm 231$a$ with the second support arm 231$b$" refers to that the first support arm 231$a$ and the second support arm 231$b$ may be connected with each other via the connection member and may rotate with respect to each other.

Based on the above embodiments, in an embodiment of the present disclosure, the distance between the first support arm 231$a$ and the second support arm 231$b$ is greater than zero in the case that the first support arm 231$a$ and the second support arm 231$b$ are in the first use state, to ensure that the first support arm 231$a$ and the second support arm 231$b$ can rotate around an axis in the intermediate region between the first support arm 231$a$ and the second support arm 231$b$, and reduce the resistance generated during the process that the first support arm 231$a$ and the second support arm 231$b$ are bent around the axis in the intermediate region, so that the flexible display device can be bent around the axis in the intermediate region between the first support arm 231$a$ and the second support arm 231$b$, and the bending resistance generated during the process that the flexible display device is bent can be reduced.

It should be noted that, with a small distance between the first support arm 231$a$ and the second support arm 231$b$ in the case that the first support arm 231$a$ and the second support arm 231$b$ are in the first use state, the deviation between the actual bending trajectory and the predetermined bending trajectory is small during the process that the flexible display device is bent. In a case that the distance between the first support arm 231$a$ and the second support arm 231$b$ is zero, the deviation between the actual bending trajectory and the predetermined bending trajectory of the flexible display device may be reduced to the full extent, but the bending resistance of the flexible display device is greatly increased and the dead bending occurs during the process that the flexible display device is bent, which is caused by the fact that the first support arm 231$a$ and the second support arm 231$b$ are in contact with each other. Therefore, in the embodiment of the present disclosure, the distance between the first support arm 231$a$ and the second support arm 231$b$ is greater than zero, and the distance may be required to be as small as possible on a condition that the bending resistance of the flexible display device is not excessively increased, so as to reduce the deviation between the actual bending trajectory and the predetermined bending trajectory of the flexible display device as much as possible, so that the flexible display device can be bent in accordance with the predetermined bending trajectory.

In addition, multiple implementations of the connection member are further provided in the embodiment, as shown in FIG. 5 and FIG. 6. In the flexible display device shown in FIG. 5, the connection member has a triangular shape when viewed from a side. In the flexible display device shown in FIG. 6, the connection member has an elliptical shape when viewed from a side. In other embodiments of the present disclosure, the connection member may have other shapes such as a rectangle, an irregular polygon when viewed from a side, which is not limited in this embodiment.

Based on any one of the above embodiments, as shown in FIG. 5, in the embodiment of the present disclosure, the connection member 501 includes a first sub connection member 5011 and a second sub connection member 5012. The first sub connection member 5011 and the second sub connection member 5012 are arranged on two sides of the support structure 23 respectively, so that the first support arm 231a is rotatable connected to the second support arm 231b via the first sub connection member 5011 and the second sub connection member 5012. That is, the first support arm 231a is rotatably connected to the second support arm 231b via the first sub connection member 5011 at one end and via the second sub connection member 5012 at the other end, to define the relative position between the first support arm 231a and the second support arm 231b by connecting the first support arm 231a with the second support arm 231b at the two ends.

Specifically, based on any one of the above embodiments, in an embodiment of the present disclosure, a first through hole is provided on a side of the first support arm 231a close to the second support arm 231b, and a second through hole is provided on a side of the second support arm 231b close to the first support arm 231a. The connection member 501 is provided with a first bump to be embedded into the first through hole and a second bump to be embedded into the second through hole. In this case, the connection member 501 may be embedded into the first through hole of the first support arm 231a by using the first bump and embedded into the second through hole of the second support arm 231b by using the second bump, so as to realize the rotational connection between the first support arm 231a and the second support arm 231b.

It should be noted that, in the embodiment of the present disclosure, the first through hole of the first support arm 231a may penetrate through the first support arm 231a or may not penetrate through the first support arm 231a. The length of the first through hole in a direction parallel to the extension direction of the first support arm 231a is not limited in the present disclosure, as long as the first bump on the connection member can be embedded into the first through hole to realize the rotational connection between the connection member and the first support arm 231a.

Similarly, the second through hole of the second support arm 231b may penetrate through the second support arm 231b or may not penetrate through the second support arm 231b. The length of the second through hole in a direction parallel to the extension direction of the second support arm 231b is not limited in the present disclosure, as long as the second bump on the connection member can be embedded into the second through hole to realize the rotational connection between the connection member and the second support arm 231b.

It should further be noted that, in the above embodiment, the rotational connection between the first support arm 231a, the second support arm 231b and the connection member is realized by providing the through holes on the first support arm 231a and the second support arm 231b and providing the bumps on the connection member, but the present disclosure is not limited thereto. In other embodiments of the present disclosure, the rotational connection between the first support arm 231a, the second support arm 231b and the connection member may be realized in other hinge manners, for example, by providing bumps on the first support arm 231a and the second support arm 231b and providing through holes on the connection member.

In addition, the connection member may be connected to the set of support arms 231 in a non-binge manner, which is not limited in the present disclosure.

Based on any one of the above embodiments, in an embodiment of the present disclosure, both a side of the first support arm 231a close to the second support arm 231b and a side of the second support arm 231b close to the first support arm 231a extend in a first direction Y. The first direction Y is perpendicular to a direction X in which the first support arm 231a and the second support arm 231b are arranged. In this case, during the process that the flexible display device is bent, the bending axis of the flexible display device is not only defined in the region between the first support arm 231a and the second support arm 231b, but also parallel to the first direction, so that the bending axis of the flexible display device is perpendicular to the direction X of the bottom edge a1 of the flexible display panel.

Specifically, in an embodiment of the present disclosure, each of the first support arm 231a and the second support arm 231b has a first set of parallel sides extending in the direction X and a second set of parallel sides extending in the direction Y. Among the second set of parallel sides, a side of the first support arm 231a away from the second support arm 231b is defined as a first side of the support structure 23, a side of the first support arm 231a close to the second support arm 231b is defined as a second side of the support structure 23, a side of the second support arm 231b close to the first support arm 231a is defined as a third side of the support structure 23, and a side of the second support arm 231b away from the first support arm 231a is defined as a fourth side of the support structure 23. Among the first set of parallel sides, a side of the first support arm 231a connecting one end of the first side and one end of the second side is defined as a fifth side of the first support arm 231a, a side of the first support arm 231a connecting the other end of the first side and the other end of the second side is defined as a sixth side of the first support arm 231a, a side of the second support arm 231b connecting one end of the third side and one end of the fourth side is defined as a seventh side of the second support arm 231b, and a side of the second support arm 231b connecting the other end of the third side and the other end of the fourth side is defined as an eighth side of the second support arm 231b. The fifth side and the seventh side are located on a same side of the support structure 23, and the sixth side and the eighth side are located on a same side of the support structure 23.

In the above embodiment, in the case that the connection member includes the first sub connection member 5011 and the second sub connection member 5012, the first sub connection member 5011 is located between the second side and the third side to connect the fifth side and the seventh side, and the second sub connection member 5012 is located between the second side and the third side to connect the sixth side and the eighth side.

Figure 9:
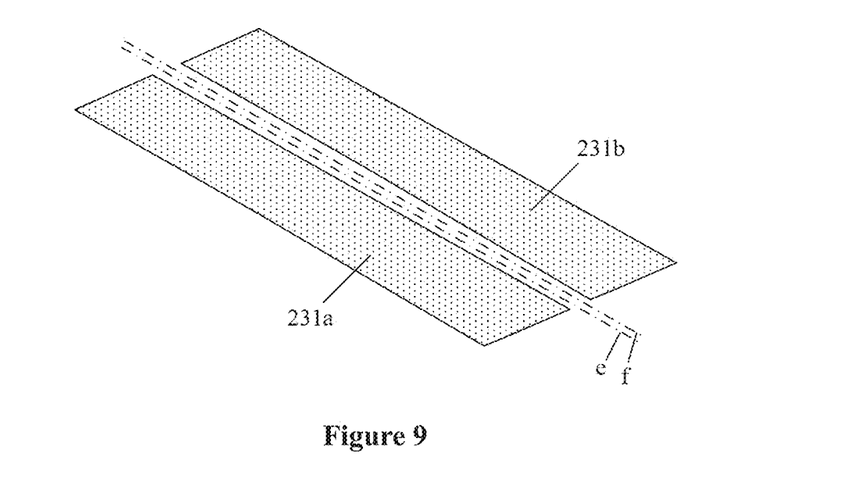
FIG. 9 is a schematic view showing a position where a bending axis is located in a flexible display device according to an embodiment of the present disclosure.

It should be noted that, in the above embodiment, if the distance between the first support arm 231a and the second support arm 231b is greater than zero, the actual bending axis can be defined in the region between the first support arm 231*a* and the second support arm 231*b* (i.e., between the second side and the third side) during the process that the flexible display device is bent, but the position of the actual bending axis between the first support arm 231*a* and the second support arm 231*b* may not be controlled. As shown in FIG. 9, the actual bending axis may be located at a position indicated by e, f or other positions between the first support arm 231*a* and the second support arm 231*b*. That is, the actual bending axis may be located anywhere between the second side and the third side.

Figure 10:
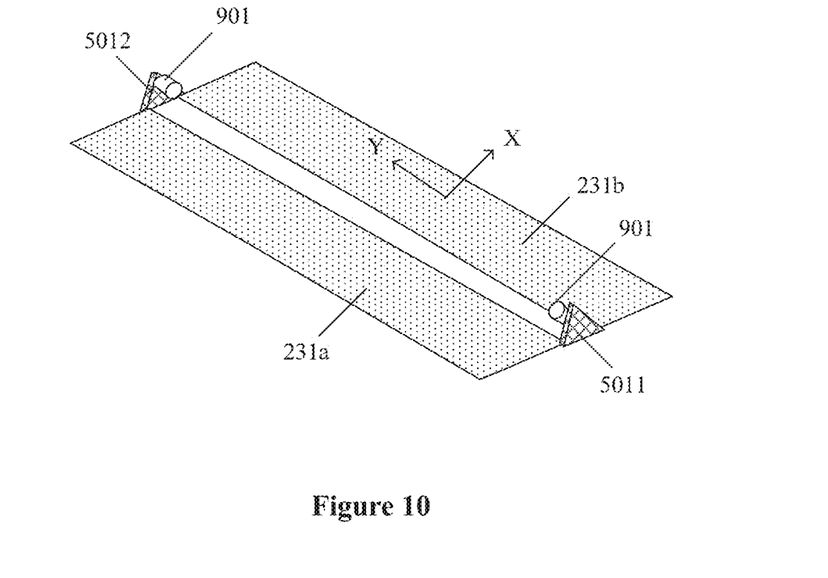
FIG. 10 is a schematic structural diagram of a flexible display device according to another embodiment of the present disclosure.

Based on the above embodiments, reference is made to FIG. 10, which is a schematic structural diagram of a flexible display device according to another embodiment of the present disclosure. Specifically, in the embodiment of the present disclosure, each of the first sub connection member 5011 and the second sub connection member 5012 is provided with a support member 901. The support member 901 is used for providing a bending fulcrum for the rigid structure 22 so that the rigid structure 22 is bent at a preset angle around a bending axis where the bending fulcrum is located, and thus the flexible display device can only be bent at the preset angle around the bending axis defined by using the support member, avoiding the uncertainty of the position of the bending axis of the flexible display device between the first support arm 231*a* and the second support arm 231*b*, and reducing the deviation between the actual bending axis and the predetermined bending axis during the process that the flexible display device is bent to the full extent, thereby increasing the accuracy of bending the flexible display device around the predetermined bending axis.

It should be noted that, in this embodiment, the support member 901 may have various structures. For example, the support member 901 may be a roller, or may have a cuboid structure, a triangular prism structure, or other structures, which is not limited in the present disclosure, as long as the position of the bending axis can be defined. In a case that the support member 901 is a roller, an axial direction of the roller is parallel to the direction in which the bending axis of the rigid structure 22 extends, that is, the axial direction of the roller is parallel to the direction Y. In a case that the support member 901 has a cuboid structure, each of sides of the cuboid is parallel to the direction in which the bending axis of the rigid structure 22 extends, that is, the sides of the cuboid are parallel to the direction Y. In a case that the support member 901 has a triangular prism structure, each of edges of the triangular prism is parallel to the direction in which the bending axis of the rigid structure 22 extends, that is, the edges of the triangular prism are parallel to the direction Y, to ensure that the bending axis of the flexible display device is parallel to the direction Y.

In the case that the support member has a cuboid structure, there are more contact points between the support member 901 and the rigid structure 22 in a direction from the first support arm 231*a* to the second support arm 231*b* during the process that the flexible display device is bent. In the case that the support member 901 has a roller structure, there are less contact points between the support member 901 and the rigid structure 22 in a direction from the first support arm 231*a* to the second support arm 231*b* during the process that the flexible display device is bent. One of the contact points corresponds to one position coordinate. Therefore, in the embodiment of the present disclosure, the support member 901 has a specific structure, so that less contact points are generated between the support member 901 and the rigid structure 22 in the direction from the first support arm 231*a* to the second support arm 231*b* during the process that the flexible display device is bent, thereby further improving the accuracy of bending the flexible display device around the predetermined bending axis.

It should further be noted that, during the specific usage process of the flexible display device, the predetermined bending axis of the flexible display device is not constant. For example, in a scenario A, the flexible display device may be required to be bent at a certain angle around a predetermined bending axis located at a first position. In a scenario B, the flexible display device may be required to be bent at a certain angle around a predetermined bending axis located at a second position different from the first position. In order to meet bending requirements for the flexible display device in different usage scenarios, based on any one of the above embodiments, in an embodiment of the present disclosure, the rigid structure 22 includes a first side and a second side adjacent to each other, where an extension direction of the first side is parallel to a direction in which the first support arm 231*a* and the second support arm 231*b* are arranged. The support structure 23 is slidably connected to the rigid structure 22 in the direction in which the first side of the rigid structure 22 extends. In the flexible display device according to the embodiment of the present disclosure, the support structure 23 may be moved to different positions on the first side of the rigid structure 22, so that the rigid structure 22 can be bent at any position on the first side, and thus the flexible display device can be bent at any position in the direction of the first side of the rigid structure 22.

In one embodiment of the present disclosure, a set of parallel sides of the rigid structure 22 corresponding to the bottom edge a1 and the bottom edge a3 of the flexible display panel 21 is defined as first sides, and a set of parallel sides of the rigid structure 22 corresponding to the bottom side a2 and the bottom side a4 of the flexible display panel 21 is defined as second sides. That is, the sides of the rigid structure 22 parallel to the direction in which the first support arm 231*a* and the second support arm 231*b* extend are the second sides, and the sides of the rigid structure 22 close to the second sides are the first sides. The direction Y is defined as an extension direction of the first support arm 231*a* and the second support arm 231*b*. In a case that the first side of the rigid structure 22 is perpendicular to the second side of the rigid structure 22, the first side of the rigid structure 22 is parallel to the direction X, and the second side of the rigid structure 22 is parallel to the direction Y. In the flexible display device according to the embodiment of the present disclosure, the support structure 23 may be moved to different positions on the first side of the rigid structure 22, so that the rigid structure 22 can be bent at any position on the first side, and thus the flexible display device can be bent at any position in the direction X.

The usage principle of the flexible display device according to this embodiment is described below with reference to the arrangement of the rigid structure.

In one embodiment, in a case that the flexible display device may be required to be bent at a predetermined position, the support structure 23 is moved in the direction X parallel to the first side of the rigid structure 22, so that the support members 901 of the support structure 23 are located at the predetermined position of the flexible display device. The flexible display device is controlled to be bent around a bending axis formed by a line connecting the support members 901, thereby realizing the bending of the flexible display device around the bending axis at the predetermined position.

It can be seen that in the embodiment, the flexible display device may be bent at any position in the direction X of the bottom edge a1 by controlling positions of the support members 901 of the support structure 23 on the flexible display panel 21.

It should be noted that, as described above, the support member 901 may be a roller, or may have other structures such as a cuboid structure or a triangular prism structure. In the case that the support member 901 is a roller, rolling friction force is generated between the support member 901 and the rigid structure 22 during the movement of the support structure 23 along the first side of the rigid structure 22. In the case that the support member 901 has a cuboid structure or a triangular prism structure, sliding friction force is generated between the support member 901 and the rigid structure 22 during the movement of the support structure 23 along the first side of the rigid structure 22. Under the same gravity, the rolling friction force is smaller than the sliding friction force. Therefore, the support member 901 is implemented by a roller, reducing the movement resistance of the support structure 23 moving to any position of the flexible display device.

Figure 11:
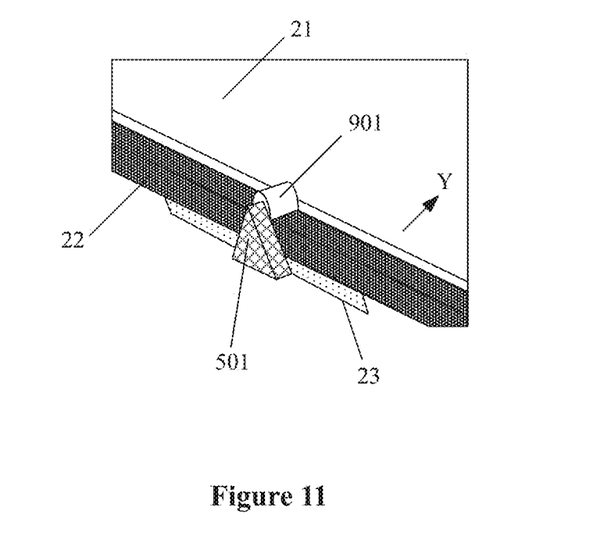
FIG. 11 is a partial schematic view of a flexible display device according to another embodiment of the present disclosure.

Based on any one of the above embodiments, in an embodiment of the present disclosure, a position relationship between the flexible display panel 21 and the support member 901 is further described in the present embodiment. Reference is made to FIG. 11, which is a partial schematic view of a flexible display device according to another embodiment of the present disclosure. An orthographic projection of the flexible display panel 21 on the first surface of the rigid structure 22 does not overlap an orthographic projection of the support member 901 on the first surface of the rigid structure 22. That is, the support member 901 is not in contact with the flexible display panel 21 in the direction Y shown in FIG. 11, so that the support member 901 does not press the flexible display panel 21 when providing the bending fulcrum for the rigid structure 22. In this way, the flexible display panel 21 is not damaged by the support member 901, ensuring the normal display of the flexible display panel 21.

Figure 12:
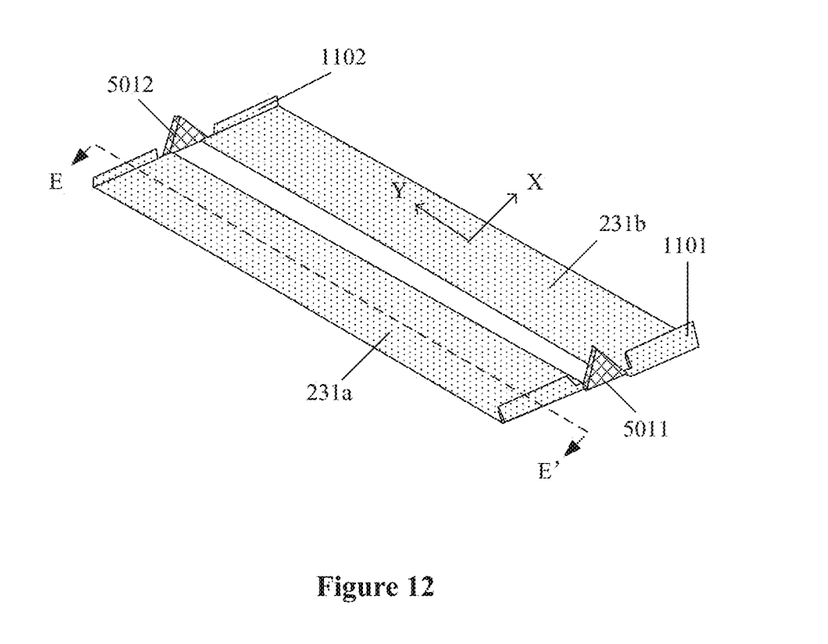
FIG. 12 is a partial schematic view of a flexible display device according to another embodiment of the present disclosure.
Figure 13:
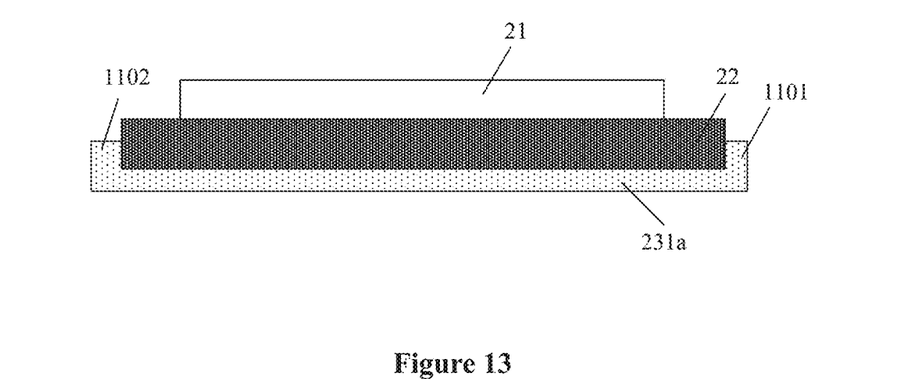
FIG. 13 is a schematic sectional view of the flexible display device taken along a line EE' shown in FIG. 12.

Based on any one of the above embodiments, in an embodiment of the present disclosure, reference is made to FIG. 12 and FIG. 13. FIG. 12 is a partial schematic view of a flexible display device according to another embodiment of the present disclosure, and FIG. 13 is a schematic sectional view of the flexible display device taken along a line EE' shown in FIG. 12. In the embodiment of the present disclosure, the fifth side and the sixth side of the first support arm 231a are respectively provided with a bump portion 1101 and a bump portion 1102, and the seventh side and the eighth side of the second support arm 231b are respectively provided with a bump portion 1101 and a bump portion 1102. One terminal of each of the bump portion 1101 and of the hump portion 1102 is connected to a bottom surface of the first support arm 231a or the second support arm 231b, and the other terminal of each of the bump portion 1101 and of the bump portion 1102 extends in a direction parallel to the direction from the rigid structure 22 to the flexible display panel 21. The sides of the rigid structure 22 may be fixed by using the bump portion 1101 and the bump portion 1102, to avoid that the rigid structure is detached from the support structure 23 during the process that the rigid structure is bent.

Figure 14:
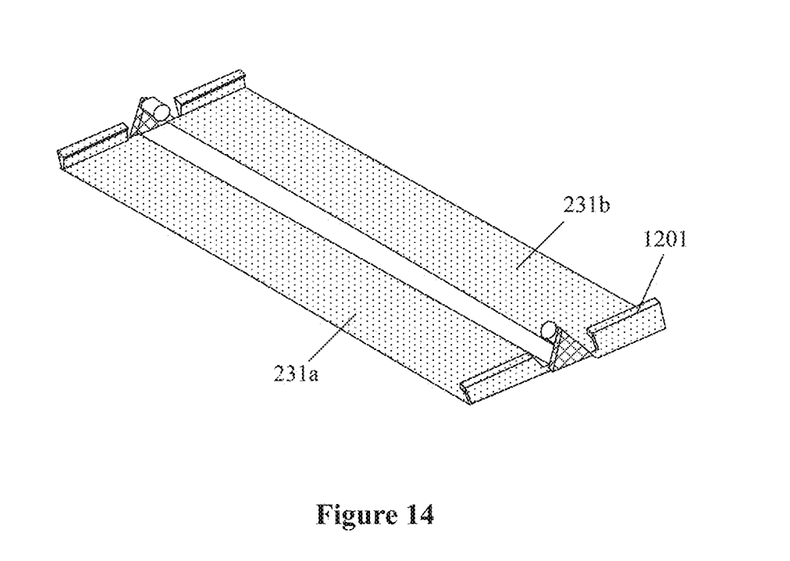
FIG. 14 is a schematic structural diagram of a support structure in a flexible display device according to another embodiment of the present disclosure.
Figure 15:
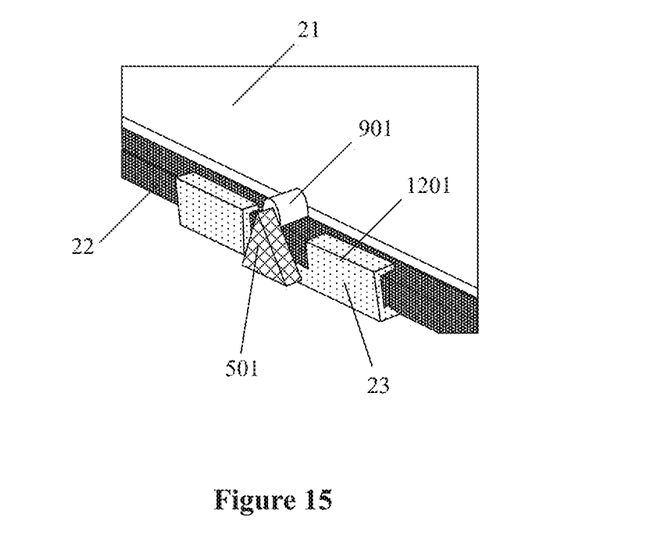
FIG. 15 is a partial schematic view of a flexible display device according to another embodiment of the present disclosure.

Based on any one of the above embodiments, reference is made to FIG. 14 and FIG. 15. FIG. 14 is a schematic structural diagram of a support structure in a flexible display device according to another embodiment of the present disclosure, and FIG. 15 is a partial schematic view of a flexible display device according to another embodiment of the present disclosure. In the flexible display device, each of the first support arm 231a and the second support arm 231b is provided with engagement structures 1201 for engaging the rigid structure 22. The rigid structure 22 is engaged into a first support space formed by the first support arm 231a and the second support arm 231b via the engagement structures 1201, as shown in FIG. 15.

Based on the above embodiment, in an embodiment of the present disclosure, in a case that each of the first support arm 231a and the second support arm 231b has the bump portion 1101 and the bump portion 1102, the engagement structures 1201 may be arranged on the bump portion 1101 and the bump portion 1102, so that the first side of the rigid structure 22 is surrounded by the support structure 23. In this way, the rigid structure 22 can only be bent according to the combined state of the support structure 23, and may not be detached from the support structure 23.

In one embodiment, the engagement structures 1201 are located at two ends of the first support arm 231a and two ends of the second support arm 231b. Each of the engagement structures 1201 includes an engagement groove for engaging the rigid structure 22. In an embodiment of the present disclosure, the engagement groove may be used to realize relative fixing between the support structure 23 and the rigid structure 22 in the direction Y. In another embodiment, the engagement groove may be used to realize relative sliding between the support structure 23 and the rigid structure 22 in the direction X.

It should be noted that the engagement structure 1201 may be implemented in various manners, which is not described one by one in this embodiment, as long as the rigid structure 22 can be engaged. In this embodiment, the rigid structure is engaged by using the engagement grooves, and the engagement grooves may be in a "C" shape, respectively arranged at two ends of the first support arm 231a (i.e., on the fifth side and the sixth side of the first support arm 231a) and two ends of the second support arm 231b (i.e., on the seventh side and the eighth side of the second support arm 231b).

In addition, a position relationship between the flexible display panel 21 and the engagement structure 1201 is further described in the embodiment. For example, an orthographic projection of the flexible display panel 21 on the first surface of the rigid structure 22 does not overlap an orthographic projection of the engagement structure 1201 on the first surface of the rigid structure 22. That is, the engagement structure 1201 is not in contact with the flexible display panel 21 in the direction Y, so that the normal display of the flexible display panel 21 is not affected while the support structure 23 and the rigid structure 22 can be used together.

It should be noted that, in the above embodiment, the rigid structure 22 is fixed to the support structure 23 by using the engagement structure 1201, but the present disclosure is not limited thereto. In other embodiments of the present disclosure, the rigid structure 22 may be fixed to the support structure 23 in other means or a means in combination with the engagement structure, which is not limited in the present disclosure.

Figure 16:
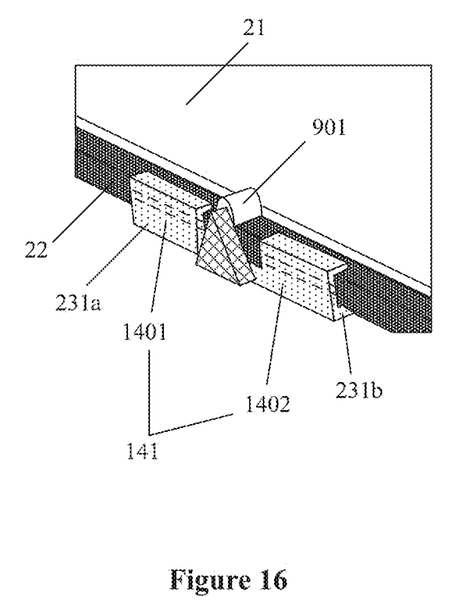
FIG. 16 is a schematic structural diagram of a flexible display device according to another embodiment of the present disclosure.

Based on any one of the above embodiments, reference is made to FIG. 16, which is a schematic structural diagram of a flexible display device according to another embodiment of the present disclosure. In the embodiment of the present disclosure, the flexible display device further includes fixing members 141 by which the rigid structure 22 is fixed to the support structure 23. In one embodiment, the fixing members 141 include a first fixing member 1401 and a second fixing member 1402. The first support arm 231a is fixed to the rigid structure 22 by the first fixing member 1401, and the second support arm 231b is fixed to the rigid structure 22 by the second fixing member 1402. In the embodiment of the present disclosure, since the position of the support structure 23 is fixed with respect to the rigid structure 22, the position of the bending axis formed by the support structure 23 on the rigid structure 22 is fixed, so that the rigid structure can be bent around the fixed bending axis to drive the flexible display panel 21 supported by the rigid structure to be bent around the fixed bending axis.

Figure 17:
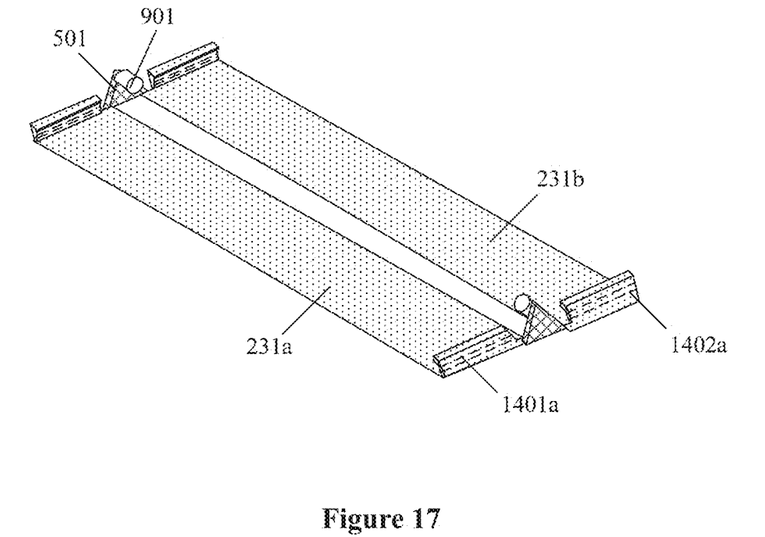
FIG. 17 is a schematic structural view of a support structure in a case that a rigid structure is fixed to the support structure by a fixing member according to an embodiment of the present disclosure.
Figure 18:
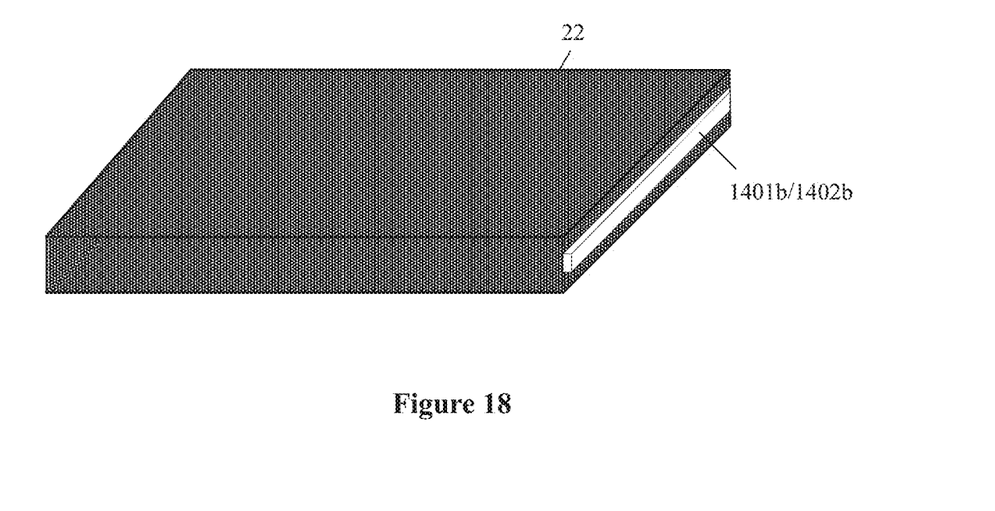
FIG. 18 is a schematic structural view of a rigid structure in a case that the rigid structure is fixed to a support structure by a fixing member according to an embodiment of the present disclosure.

In one embodiment, reference is made to FIG. 17 and FIG. 18. FIG. 17 is a schematic structural view of the support structure 23 in a case that the rigid structure 22 is fixed to the support structure 23 by the fixing member 141 according to an embodiment of the present disclosure, and FIG. 18 is a schematic structural view of the rigid structure 22 in the case that the rigid structure 22 is fixed to the support structure 23 by the fixing member 141 according to an embodiment of the present disclosure. In the embodiments of the present disclosure, a side of the first support arm 231a facing towards the rigid structure 22 is provided with a groove 1401a, a side of the second support arm 231b facing towards the rigid structure 22 is provided with a groove 1402a, and a side of the rigid structure 22 facing towards the first support arm 231a and/or the second support arm 231b is provided with a bump 1401b (or 1402b), so that the support structure 23 is fixed to the rigid structure 22 by an interference fit between the groove 1401a/1402a and the bump 1401b/1402b.

In another embodiment of the present disclosure, a surface of the first support arm 231a facing towards the rigid structure 22 is provided with a third bump, and a surface of the second support arm 231b facing towards the rigid structure 22 is provided with a fourth bump. A lower surface (i.e., a surface of the rigid structure facing away from the flexible display panel) of the rigid structure 22 is provided with a third groove fitted with the third bump and a fourth groove fitted with the fourth bump, so that the first support arm 231a can be fixed to the rigid structure 22 by engaging the third bump into the third groove, and the second support arm 231b can be fixed to the rigid structure 22 by engaging the fourth hump into the fourth groove, thereby fixing the support structure to the rigid structure. However, the present disclosure is not limited thereto. In other embodiments of the present disclosure, the support structure 23 may be fixed to the rigid structure 22 in other manners, which is not limited in the embodiment of the present disclosure.

Figure 19:
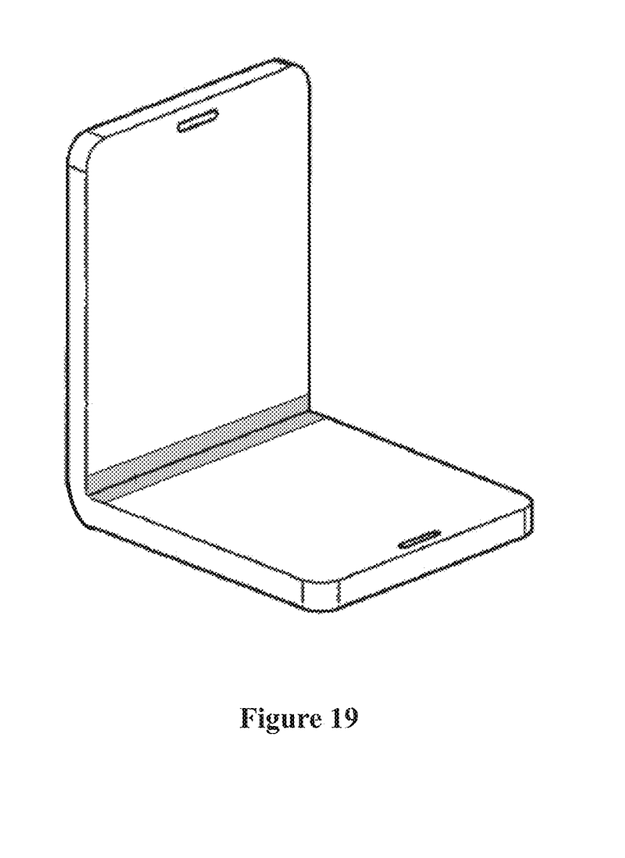
FIG. 19 is a schematic structural diagram of an electronic device according to an embodiment of the present disclosure.

In addition, an electronic device is further provided according to an embodiment of the present disclosure. Reference is made to FIG. 19, which is a schematic structural diagram of an electronic device according to an embodiment of the present disclosure. The electronic device includes any one flexible display device described above. The electronic device may be a device having a display function, such as a mobile phone, a tablet computer, and an all-in-one computer.

In summary, with the flexible display device and the electronic device including the flexible display device according to the embodiments of the present disclosure, the flexible display panel 21 is supported by the rigid structure, the rigid structure is further supported by the support structure 23, an actual bending axis of the rigid structure 22 is defined in the region between the first support arm 231a and the second support arm 231b by using the support structure 23, and the flexible display panel 21 is driven to be bent by fixedly connecting the rigid structure 22 to the flexible display panel 21. In this way, an actual bending axis of the flexible display panel 21 is defined in the region between the first support arm 231a and the second support arm 231b, and the deviation between the actual bending axis formed during the process that the flexible display device is bent and the predetermined bending axis is reduced, so that the flexible display device can be bent in accordance with the predetermined bending trajectory. After the flexible display panel 21 is bent, the bending state of the flexible display panel 21 is maintained by using the rigid structure 22, thereby maintaining the flexible display panel 21 at the current attitude.

The invention claimed is:

1. A flexible display device, comprising:
a flexible display panel;
a rigid structure having a first surface supporting the flexible display panel; and
a support structure comprising a set of support arms,
wherein the set of support arms comprises a first support arm and a second support arm, the first support arm and the second support arm have separated structures and are configured to support the rigid structure;
the rigid structure is bent at a preset angle based on a combined state of the set of support arms so that the flexible display panel supported by the rigid structure is bent at a same angle as the preset angle;
the combined state of the set of support arms comprises a first use state and a second use state, the first support arm and the second support arm are located on a same plane in the first use state, and the preset angle is formed between the first support arm and the second support arm in the second use state;
wherein the support structure further comprises: a connection member, wherein the first support arm is hinged with the second support arm via the connection member;
wherein the connection member comprises: a first sub connection member; and a second sub connection member, wherein the first sub connection member and the second sub connection member are arranged on two sides of the support structure respectively, so that the first support arm is rotatably connected to the second support arm via the first sub connection member and the second sub connection member; and
wherein each of the first sub connection member and the second sub connection member is provided with a support member, and the support member is configured to provide a fulcrum for the rigid structure so that the rigid structure is bent at the preset angle around the fulcrum.

2. The flexible display device according to claim 1, wherein an orthographic projection of the flexible display panel on the first surface of the rigid structure does not overlap an orthographic projection of the support member on the first surface.

3. The flexible display device according to claim 1, wherein the support member comprises a roller having an axis parallel to a bending axis of the rigid structure.

4. The flexible display device according to claim 1, wherein each of the first support arm and the second support arm is provided with engagement structures for engaging the rigid structure, and
the rigid structure is engaged into a first support space formed by the first support arm and the second support arm via the engagement structures.

5. The flexible display device according to claim 4, wherein an orthographic projection of the flexible display panel on the first surface of the rigid structure does not overlap an orthographic projection of each of the engagement structures on the first surface.

6. The flexible display device according to claim 4, wherein the engagement structures are located at two ends of the first support arm and two ends of the second support arm, and each of the engagement structures comprises an engagement groove for engaging the rigid structure.

7. The flexible display device according to claim 1, wherein both a side of the first support arm close to the second support arm and a side of the second support arm close to the first support arm extend in a first direction.

8. The flexible display device according to claim 1, further comprising:
fixing members comprising a first fixing member and a second fixing member, wherein
the first support arm is fixed to the rigid structure by the first fixing member, and the second support arm is fixed to the rigid structure by the second fixing member.

9. The flexible display device according to claim 1, wherein the rigid structure comprises a first side and a second side adjacent to each other, an extension direction of the first side being parallel to a direction in which the first support arm and the second support arm are arranged, and the support structure is slidably connected to the rigid structure in an extension direction of the first side of the rigid structure.

10. An electronic device, comprising:
a flexible display device, wherein the flexible display device comprises:
a flexible display panel;
a rigid structure having a first surface supporting the flexible display panel; and
a support structure comprising a set of support arms, wherein the set of support arms comprises a first support arm and a second support arm, the first support arm and the second support arm have separated structures and are configured to support the rigid structure;
the rigid structure is bent at a preset angle based on a combined state of the set of support arms so that the flexible display panel supported by the rigid structure is bent at a same angle as the preset angle;
the combined state of the set of support arms comprises a first use state and a second use state, the first support arm and the second support arm are located on a same plane in the first use state, and the preset angle is formed between the first support arm and the second support arm in the second use state;
wherein the support structure further comprises: a connection member, wherein the first support arm is hinged with the second support arm via the connection member;
wherein the connection member comprises: a first sub connection member; and a second sub connection member, wherein the first sub connection member and the second sub connection member are arranged on two sides of the support structure respectively, so that the first support arm is rotatably connected to the second support arm via the first sub connection member and the second sub connection member; and
wherein each of the first sub connection member and the second sub connection member is provided with a support member, and the support member is configured to provide a fulcrum for the rigid structure so that the rigid structure is bent at the preset angle around the fulcrum.

11. The electronic device according to claim 10, wherein each of the first support arm and the second support arm is provided with engagement structures for engaging the rigid structure, and
the rigid structure is engaged into a first support space formed by the first support arm and the second support arm via the engagement structures.

12. The electronic device according to claim 10, wherein both a side of the first support arm close to the second support arm and a side of the second support arm close to the first support arm extend in a first direction.

13. The electronic device according to claim 10, further comprising:
fixing members comprising a first fixing member and a second fixing member, wherein
the first support arm is fixed to the rigid structure by the first fixing member, and the second support arm is fixed to the rigid structure by the second fixing member.

14. The electronic device according to claim 10, wherein the rigid structure comprises a first side and a second side adjacent to each other, an extension direction of the first side being parallel to a direction in which the first support arm and the second support arm are arranged, and the support structure is slidably connected to the rigid structure in an extension direction of the first side of the rigid structure.

* * * * *